United States Patent
Miyashita et al.

(10) Patent No.: US 7,214,921 B2
(45) Date of Patent: May 8, 2007

(54) PHOTOELECTRIC CONVERTING LAYER LAMINATION TYPE SOLID-STATE IMAGE PICK-UP DEVICE

(75) Inventors: Takeshi Miyashita, Asaka (JP); Takeshi Misawa, Asaka (JP)

(73) Assignee: FujiFilm Corporation, Tokyo (JP)

( * ) Notice: Subject to any disclaimer, the term of this patent is extended or adjusted under 35 U.S.C. 154(b) by 0 days.

(21) Appl. No.: 11/356,016

(22) Filed: Feb. 17, 2006

(65) Prior Publication Data
US 2006/0186316 A1    Aug. 24, 2006

(30) Foreign Application Priority Data
Feb. 18, 2005   (JP)   ............... P.2005-041940

(51) Int. Cl.
*H01L 27/00*    (2006.01)
*H01L 31/062*   (2006.01)

(52) U.S. Cl. ............... 250/208.1; 250/214.1; 257/291

(58) Field of Classification Search ............. 250/208.1, 250/214.1, 370.08; 257/223, 225, 290, 291, 257/440; 348/272, 274, 277
See application file for complete search history.

(56) References Cited

U.S. PATENT DOCUMENTS
2005/0205903 A1*   9/2005   Hioki .................... 257/291

FOREIGN PATENT DOCUMENTS
JP      58-103165 A    6/1983
JP      2002-83946 A   3/2002
JP      3405099 B2     3/2003

* cited by examiner

*Primary Examiner*—Kevin Pyo
(74) *Attorney, Agent, or Firm*—Birch, Stewart, Kolasch & Birch, LLP

(57) ABSTRACT

A photoelectric converting layer lamination type solid-state image pick-up device comprises: a semiconductor substrate; at least three layers of photoelectric converting layers each of which is interposed between a common electrode layer and pixel electrode layers, the pixel electrode layers corresponding to pixels respectively, wherein said at least three layers of photoelectric converting layers are laminated through insulating layers, said at least three layers of photoelectric converting layers being above the semiconductor substrate, and wherein each of said at least three layers of photoelectric converting layers is separated into layers corresponding the pixels respectively.

4 Claims, 5 Drawing Sheets

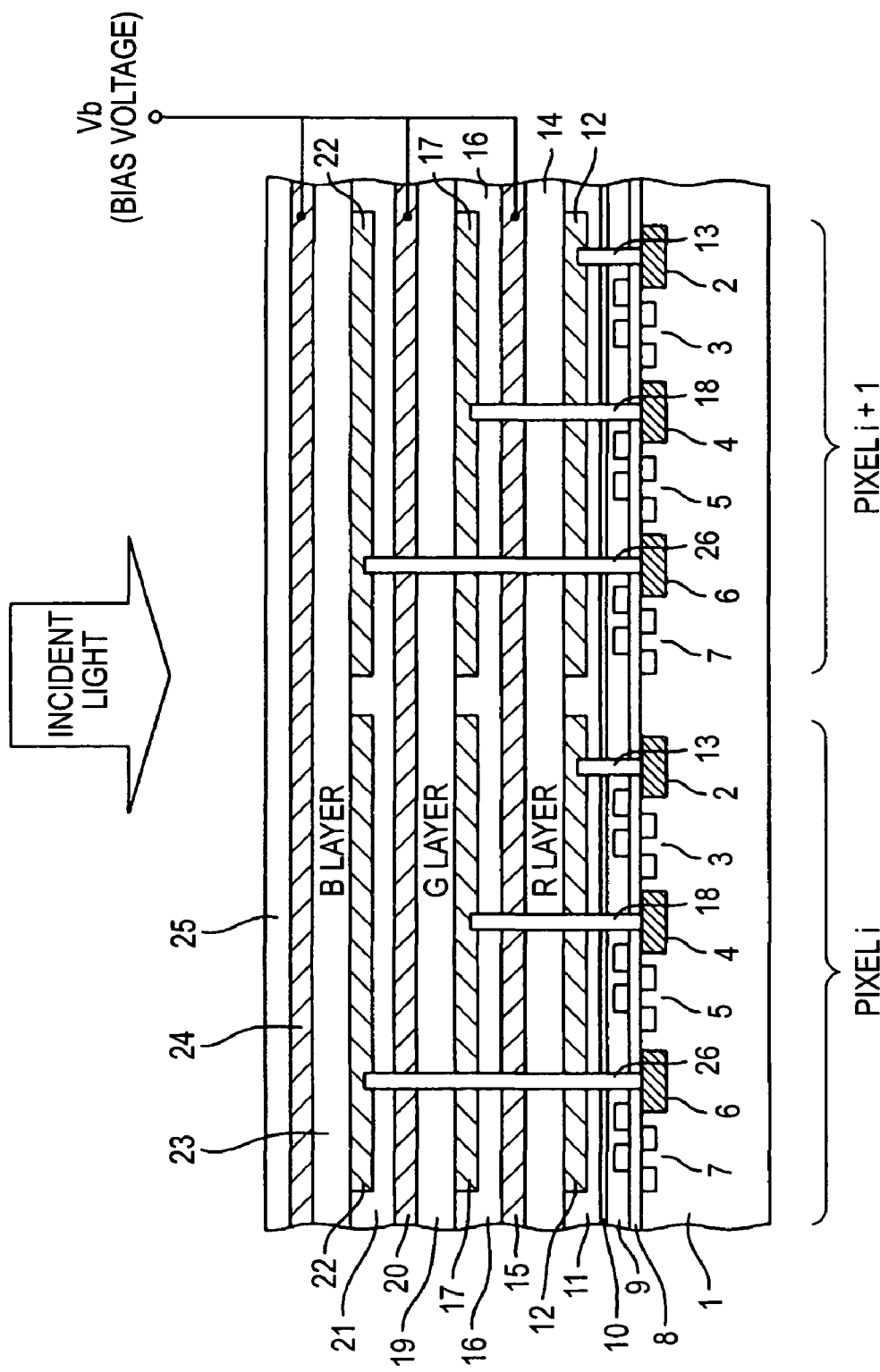

PHOTOELECTRIC CONVERTING LAYER LAMINATION TYPE SOLID-STATE IMAGE PICK-UP DEVICE

BACKGROUND OF THE INVENTION

1. Field of the Invention

The present invention relates to a solid-state image pick-up device in which a photoelectric converting layer for generating a signal charge corresponding to a quantity of an incident light is laminated on a semiconductor substrate on which a signal reading circuit is formed, and more particularly to a photoelectric converting layer lamination type solid-state image pick-up device in which S/N of an image signal obtained by a photoelectric converting layer is enhanced.

2. Description of the Related Art

A prototype unit of a photoelectric converting layer lamination type solid-state image pick-up device has been described in JP-A-58-103165, for example. The solid-state image pick-up device has a structure that three photosensitive layers are laminated on a semiconductor substrate and respective electric signals for red (R), green (G) and blue (B) colors detected by each photosensitive layer are read by an MOS circuit formed on a surface of the semiconductor substrate.

The solid-state image pick-up device having such a structure was proposed in the past. Subsequently, a CCD type image sensor and a CMOS type image sensor in which a large number of light receiving portions (photodiodes) are integrated on a surface portion of the semiconductor substrate and color filters for red (R), green (G) and blue (B) colors are laminated on each light receiving portion have progressed remarkably. At present, an image sensor in which several million light receiving portions (pixels) are integrated on a chip is mounted on a digital still camera.

However, the techniques of the CCD type image sensor and the CMOS type image sensor have progressed to an almost limit and a size of an opening of one light receiving portion has been close to a wavelength order of an incident light, that is, approximately 2 µm. For this reason, they have been confronted with a problem in that a manufacturing yield is poor.

Moreover, an upper limit of a quantity of optical charges stored in one light receiving portion which is microfabricated is small, that is, approximately 3000 electrons. Consequently, it has also been difficult to finely represent 256 gradations. For this reason, it has been hard to expect a more excellent image sensor of a CCD type or a CMOS type in respect of picture quality or a sensitivity.

As a solid-state image pick-up device for solving these problems, a solid-state image pick-up device proposed in JP-A-58-103165 has been reconsidered. Consequently, image sensors described in Japanese Patent No. 3405099 and JP-A-2002-83946 have been proposed newly.

The image sensor described in Japanese Patent No. 3405099 has such a structure that hyperfine particles of silicon are dispersed in a medium to form a photoelectric converting layer and three photoelectric converting layers having sizes of the hyperfine particles changed are laminated on a semiconductor substrate, and electric signals corresponding to quantities of received lights for red, green and blue colors are generated from each of the photoelectric converting layers.

Also in the image sensor described in JP-A-2002-83946, three nanosilicon layers having different particle sizes are laminated on a semiconductor substrate and each of electric signals for red, green and blue colors which are detected in the respective nanosilicon layers is read onto a storage diode formed in a surface portion of the semiconductor substrate.

FIG. 5 is a typical sectional view corresponding to two pixels for the related-art photoelectric converting layer lamination type solid-state image pick-up device. In FIG. 5, a high concentration impurity region 2 for storing a red signal, an MOS circuit 3 for reading a read signal, a high concentration impurity region 4 for storing a green signal, an MOS circuit 5 for reading a green signal, a high concentration impurity region 6 for storing a blue signal and an MOS circuit 7 for reading a blue signal are formed on a surface portion of a P well layer 1 provided on an n-type silicon substrate.

Each of the MOS circuits 3, 5 and 7 is constituted by impurity regions for a source and a drain which are formed on the surface of the semiconductor substrate and a gate electrode formed through a gate insulating layer 8. An insulating layer 9 is laminated on the gate insulating layer 8 and the gate electrodes and is flattened and a shielding layer 10 is laminated thereon. In many cases, the shielding layer is formed by a thin metal layer. Therefore, an insulating layer 11 is further formed thereon.

Signal charges stored in the high concentration impurity regions 2, 4 and 6 for storing the color signals are read to an outside by the MOS circuits 3, 5 and 7.

A pixel electrode layer 12 divided for each pixel is formed on the insulating layer 11 shown in FIG. 5. The pixel electrode layer 12 for each pixel is conducted through a columnar electrode 13 to the high concentration impurity region 2 for storing a red signal for each pixel. The columnar electrode 13 is electrically insulated from components other than the pixel electrode layer 12 and the high concentration impurity region 2.

A photoelectric converting layer 14 for detecting a red color is laminated on the pixel electrode layer 12 in a one-sheet structure in common to each pixel, and furthermore, a transparent common electrode layer 15 is formed thereon in a one-sheet structure in common to each pixel.

Similarly, a transparent insulating layer 16 is formed on the common electrode layer 15 and a transparent pixel electrode layer 17 divided for each pixel is formed thereon. Each pixel electrode layer 17 and the high concentration impurity region 4 for storing a green signal for each pixel corresponding thereto are conducted through a columnar electrode 18. The columnar electrode 18 is electrically insulated from components other than the pixel electrode layer 17 and the high concentration impurity region 4. A photoelectric converting layer 19 for detecting a green signal is formed on each pixel electrode layer 17 in a one-sheet structure in the same manner as the photoelectric converting layer 14, and a transparent common electrode layer 20 is formed thereon.

A transparent insulating layer 21 is formed on the common electrode layer 20 and a pixel electrode layer 22 divided for each pixel is formed thereon. The pixel electrode layer 22 is conducted to the high concentration impurity region 6 for storing a blue signal for each pixel corresponding thereto through a columnar electrode 26. The columnar electrode 26 is electrically insulated from components other than the pixel electrode layer 22 and the high concentration impurity region 6. A photoelectric converting layer 23 for detecting a blue signal is laminated on the pixel electrode layer 22 in a one-sheet structure in common to each pixel, a transparent common electrode layer 24 is formed thereon and a transparent protective layer 25 is formed as an uppermost layer.

When a light is incident on the solid-state image pick-up device, optical charges corresponding to the quantities of incident lights having blue, green and red colors are excided in each of the photoelectric converting layers 23, 19 and 14. A voltage is applied between the common electrode layers 24, 20 and 15 and the pixel electrode layers 22, 17 and 12 so that the respective optical charges flow into the high concentration impurity regions 2, 4 and 6 and are read as blue, green and red signals to an outside through the MOS circuits 3, 5 and 7.

In the related-art photoelectric converting layer lamination type solid-state image pick-up device shown in FIG. 5, there is a problem in that a difference in a sensitivity for each color is made and a color balance of a pick-up image is thus lost to cause a deterioration in picture quality if the photoelectric converting efficiencies of the photoelectric converting layers 14, 19 and 23 are not equal to each other. Moreover, there is also a problem in that S/N is reduced because of an insufficient pixel separation of a detection signal through each pixel electrode layer. Furthermore, there is also a problem in that a quantity of a received light in a peripheral part of the solid-state image pick-up device is smaller than that in a central part thereof and shading is thus generated in an incorporation in a digital still camera in some cases.

SUMMARY OF THE INVENTION

It is an object of the invention to provide a photoelectric converting layer lamination type solid-state image pick-up device capable of increasing a pixel separation performance of a detection signal to enhance S/N and suppressing a difference in a sensitivity for each color to improve picture quality, and furthermore, preventing shading from being generated.

The invention provides a photoelectric converting layer lamination type solid-state image pick-up device comprising: a semiconductor substrate; at least three layers of photoelectric converting layers each of which is interposed between a common electrode layer and pixel electrode layers, the pixel electrode layers corresponding to pixels respectively, wherein said at least three layers of photoelectric converting layers are laminated through insulating layers, said at least three layers of photoelectric converting layers being above the semiconductor substrate, and wherein each of said at least three layers of photoelectric converting layers is separated into layers corresponding the pixels respectively.

By this structure, a pixel separation performance of an image signal (a detection signal) detected from each pixel can be improved and S/N of the detection signal can be enhanced.

According to the invention, there is provided the photoelectric converting layer lamination type solid-state image pick-up device, wherein an area of each of said at least three layers of photoelectric converting layers is set corresponding to each of photoelectric converting characteristics of said at least three layers of photoelectric converting layers.

By this structure, the sensitivities of a layer for photoelectrically converting a red light, a layer for photoelectrically converting a green light and a layer for photoelectrically converting a blue light can be made uniform in each pixel so that a difference in the sensitivity for each color is eliminated. Consequently, it is possible to pick up a color image having a high color balance and high picture quality.

According to the invention, there is provided the photoelectric converting layer lamination type solid-state image pick-up device, wherein an area of each of said at least three layers of photoelectric converting layers for a pixel in a peripheral part of the solid-state image pick-up device is set to be larger than that of each of said at least three layers of photoelectric converting layers for a pixel in a central part of the solid-state image pick-up device.

By this structure, it is possible to avoid the generation of shading.

BRIEF DESCRIPTION OF THE DRAWINGS

FIG. 5 is a typical sectional view corresponding to two pixels of the related-art photoelectric converting layer lamination type solid-state image pick-up device.

DETAILED DESCRIPTION OF THE INVENTION

An embodiment of the invention will be described below with reference to the drawings.

Figure 1:
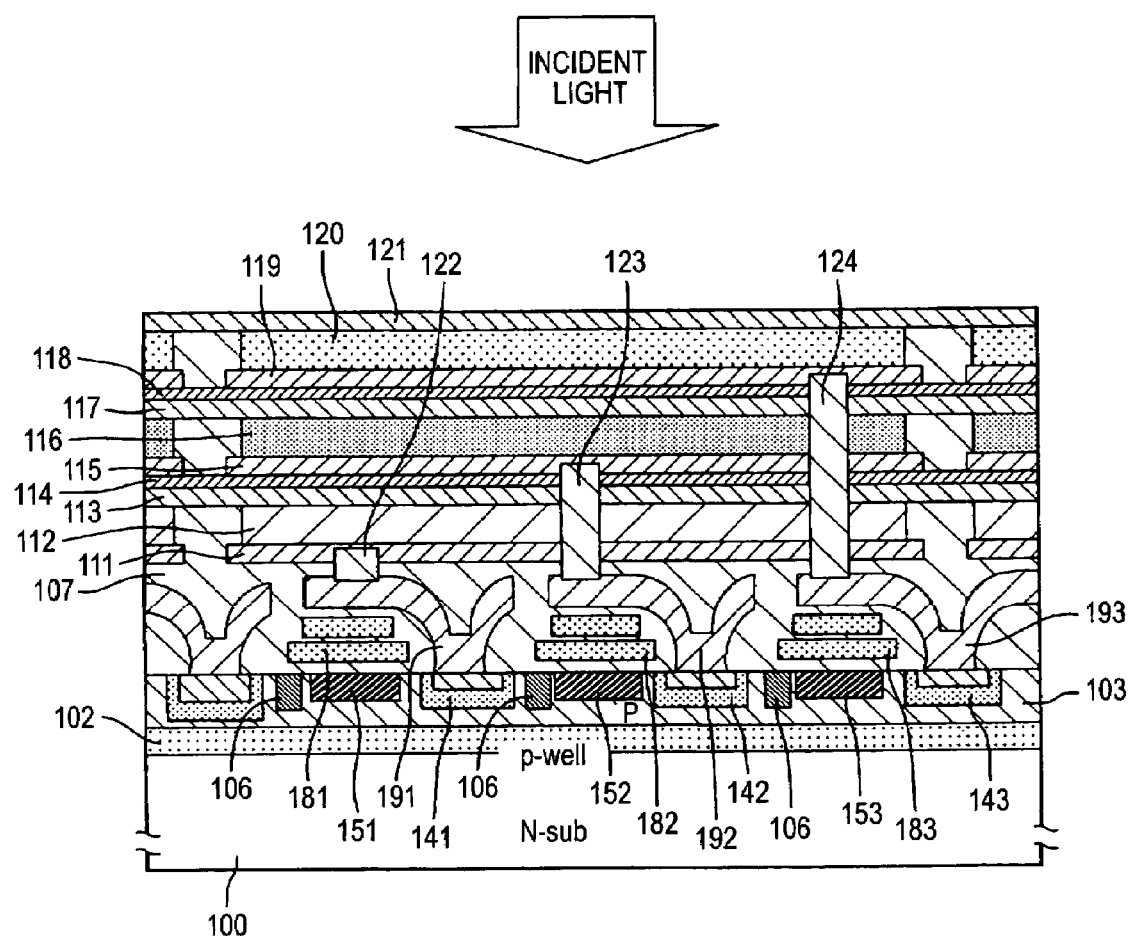
FIG. 1 is a typical sectional view corresponding to one pixel of a photoelectric converting layer lamination type solid-state image pick-up device according to a first embodiment of the invention.

FIG. 1 is a typical sectional view corresponding to one pixel of a photoelectric converting layer lamination type solid-state image pick-up device according to a first embodiment of the invention. A signal reading circuit is formed in a surface portion of a semiconductor substrate 100. The signal reading circuit may be constituted by an MOS transistor circuit in the same manner as in FIG. 5 or may be constituted by the same charge transfer path as that in the related-art CCD type image sensor as shown in FIG. 1.

In the photoelectric converting layer lamination type solid-state image pick-up device shown in FIG. 1, a P well layer 102 is formed in the surface portion of the n-type semiconductor substrate 100, and furthermore, a diode portion 141 to be a first color charge storage region, a diode portion 142 to be a second color charge storage region and a diode portion 143 to be a third color charge storage region are formed in a P region 103 in the surface portion and charge transfer paths 151, 152 and 153 are formed between the diode portions. A channel stopper 106 formed by a p+ region is provided between the diode portion 141 and the charge transfer path 151, the diode portion 142 and the charge transfer path 152, and the diode portion 143 and the charge transfer path 153 which make pairs.

An insulating layer 107 is laminated on the surface of the semiconductor substrate 100 and charge transfer electrodes 181, 182 and 183 are formed on the charge transfer paths 151, 152 and 153 in the insulating layer 107, and furthermore, electrodes 191, 192 and 193 to be connected to the diode portions 141, 142 and 143 are buried. The electrodes 191, 192 and 193 according to the embodiment also serve as shielding layers in such a manner that an incident light (mainly, an infrared ray because a visible light portion in the incident light is absorbed by a photoelectric converting layer to be an upper layer) is not incident on the signal reading circuit provided on the surface of the semiconductor substrate.

A pixel electrode layer 111 for a first color which is divided for each pixel is laminated on the insulating layer 107. The pixel electrode layer 111 is formed by a transparent material.

A first layer photoelectric converting layer 112 for photoelectrically converting an incident light having a first color provided for each pixel and is laminated on each pixel electrode layer 111, and a transparent common electrode layer (a counter electrode layer of the pixel electrode layer 111) 113 is laminated on the first layer photoelectric converting layer 112.

A transparent insulating layer 114 is laminated on the common electrode layer 113, and furthermore, a transparent pixel electrode layer 115 for a second color which is divided for each pixel is laminated thereon. Then, a second layer photoelectric converting layer 116 for photoelectrically converting an incident light having a second color is divided for each pixel and is laminated on each pixel electrode layer 115, and a transparent common electrode layer (an opposed layer to the pixel electrode layer 115) 117 is laminated on the second layer photoelectric converting layer 116.

A transparent insulating layer 118 is laminated on the common electrode layer 117, and furthermore, a transparent pixel electrode layer 119 for a third color which is divided for each pixel is laminated thereon. Then, a third layer photoelectric converting layer 120 for photoelectrically converting an incident light having a third color is divided for each pixel and is laminated on each pixel electrode layer 119, and a transparent common electrode layer (an opposed electrode to the pixel electrode layer 119) 121 is laminated on the third layer photoelectric converting layer 120. In some cases, moreover, a protective layer is formed thereon, which is not shown.

The pixel electrode layer 111 for a first color is electrically connected to the electrode 191 of the diode portion 141 for storing an electric charge having a first color through a longitudinal wiring (a columnar electrode) 122, the pixel electrode layer 115 for a second color is electrically connected to the electrode 192 of the diode portion 142 for storing an electric charge having a second color through a longitudinal wiring (a columnar electrode) 123, and the pixel electrode layer 119 for a third color is electrically connected to the electrode 193 of the diode portion 143 for storing an electric charge having a third color through a longitudinal wiring 124. The longitudinal wirings 122, 123 and 124 are insulated from components other than the electrodes 191, 192 and 193 and the pixel electrode layers 111, 115 and 119 corresponding thereto.

The materials of the photoelectric converting layers 112, 116 and 120 to be the layers may be organic or inorganic but preferably have a thin layer structure of a direct transition type, a fine particle structure or a Gratzel structure. In case of the fine particle structure, it is possible to control a band gap end. By controlling a nano particle diameter of CdSe, InP, ZnTe or ZnSe, for example, it is possible to control a wavelength region to be converted photoelectrically.

It is assumed that the first color is red (R), the second color is green (G) and the third color is clue (B). When a light is incident on the photoelectric converting layer lamination type solid-state image pick-up device, a light in a wavelength region having the blue color in the incident light is absorbed in the third layer photoelectric converting layer 120 so that an electric charge corresponding to a quantity of the absorbed light is generated and flows from the pixel electrode layer 119 into the diode portion 143 through the longitudinal wiring 124 and the electrode 193.

Similarly, a light in a wavelength region having the green color in the incident light is transmitted through the third layer photoelectric converting layer 120 and is absorbed in the second layer photoelectric converting layer 116 so that an electric charge corresponding to a quantity of the absorbed light is generated and flows from the pixel electrode layer 115 into the diode portion 142 through the longitudinal wiring 123 and the electrode 192.

Similarly, a light in a wavelength region having a red color in the incident light is transmitted through the third and second layer photoelectric converting layers 120 and 116 and is absorbed in the first layer photoelectric converting layer 112 so that an electric charge corresponding to a quantity of the absorbed light is generated and flows from the pixel electrode layer 111 into the diode portion 141 through the longitudinal wiring 122 and the electrode 191.

A signal can be fetched from each of the diode portions 141, 142 and 143 by a method in accordance with the fetch of a signal from an ordinary light receiving unit formed of silicon. For example, a constant quantity of bias charges are injected into the diode portions 141, 142 and 143 (a refresh mode) and constant charges are stored by a light incidence (a photoelectric converting mode), and a signal charge is then read. An organic light receiving unit itself can be used as a storage diode and the storage diode can also be provided separately. It is possible to apply a reading method of a CCD or CMOS sensor to the read of the signal charge.

Although the photoelectric converting layers to be the first, second and third layers in the related-art photoelectric converting layer lamination type solid-state image pick-up device have a one-sheet structure in common to the respective pixels, they are separated and formed every pixel in the photoelectric converting layer lamination type solid-state image pick-up device according to the embodiment as described above. Therefore, the pixel separation performance of optical charges flowing into the diodes 141, 142 and 143, that is, image signals (detection signals) can be improved so that S/N can also be enhanced.

Figure 2:
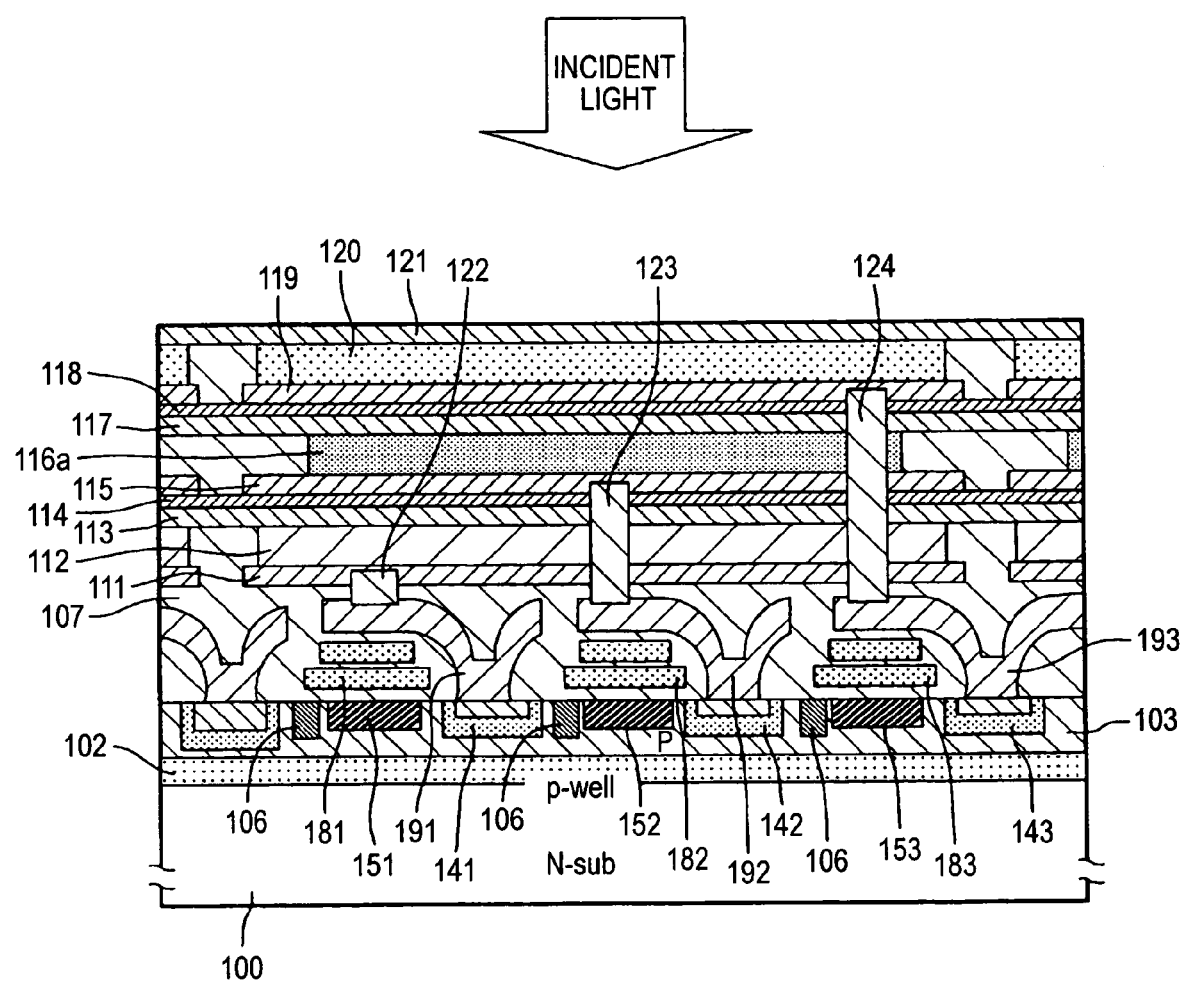
FIG. 2 is a typical sectional view corresponding to one pixel of a photoelectric converting layer lamination type solid-state image pick-up device according to a second embodiment of the invention.

FIG. 2 is a typical sectional view showing a main part corresponding to one pixel of a photoelectric converting layer lamination type solid-state image pick-up device according to a second embodiment of the invention. In the photoelectric converting layer lamination type solid-state image pick-up device according to the embodiment, most parts of the structure are the same as those in the structure of the photoelectric converting layer lamination type solid-state image pick-up device according to the first embodiment shown in FIG. 1. Therefore, the same components have the same reference numerals and description thereof will be omitted.

In the photoelectric converting layer lamination type solid-state image pick-up device according to the first embodiment shown in FIG. 1, areas of the first layer photoelectric converting layer 112, the second layer photoelectric converting layer 116 and the third layer photoelectric converting layer 120 corresponding to one pixel are set to be equal to each other. This structure has no problem if the photoelectric converting efficiencies of the first layer photoelectric converting layer 112, the second layer photoelectric converting layer 116 and the third layer photoelectric converting layer 120 are identical to each other.

Since these three photoelectric converting layers 112, 116 and 120 have different wavelength ranges for absorbing a light, however, they are manufactured by different materials and the same photoelectric converting characteristics, particularly, the identical photoelectric converting efficiencies cannot be obtained in some cases. Therefore, the embodiment is characterized in that the areas of the photoelectric converting layers 112, 116 and 120 are set to be varied depending on the materials of the photoelectric converting layers. In an example shown in FIG. 2, a photoelectric converting layer 116a for photoelectrically converting a light for a green color has a high photoelectric converting efficiency and a high sensitivity, and therefore, has an area which is smaller than the areas of the photoelectric converting layers 112 and 120 having other colors.

In the photoelectric converting layer lamination type solid-state image pick-up device according to the embodiment, consequently, a difference in a sensitivity among the photoelectric converting layers to be the three layers, that is, a difference in a sensitivity for each color is eliminated. Consequently, a color balance of a pick-up image can be enhanced so that an image of high picture quality can be picked up.

Figure 3:
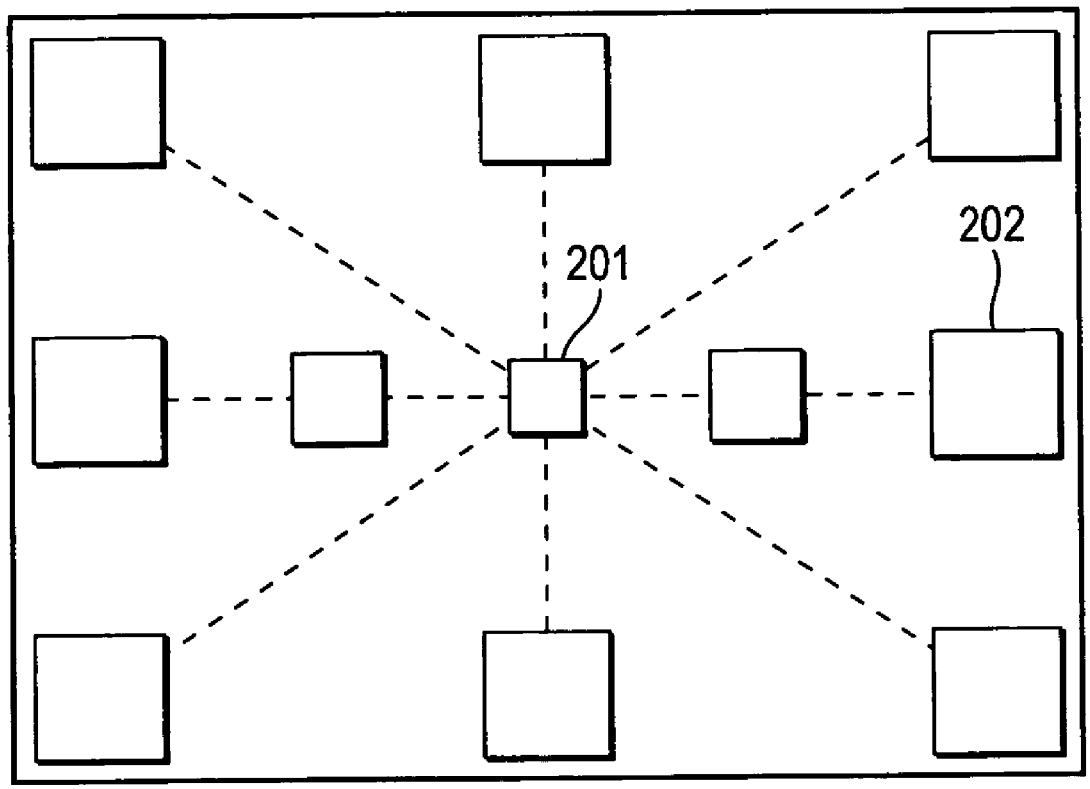
FIG. 3 is a typical view showing a surface of a photoelectric converting layer lamination type solid-state image pick-up device according to a third embodiment of the invention.

FIG. 3 is a typical view showing a surface of a photoelectric converting layer lamination type solid-state image pick-up device according to a third embodiment of the invention. In the photoelectric converting layer lamination type solid-state image pick-up device according to the embodiment, an area of a pixel 202 in a peripheral part of the device is set to be larger than that of a pixel 201 in a central part thereof. In other words, the area of the pixel is gradually increased from the central part of the device toward the peripheral part thereof.

Figure 4A:
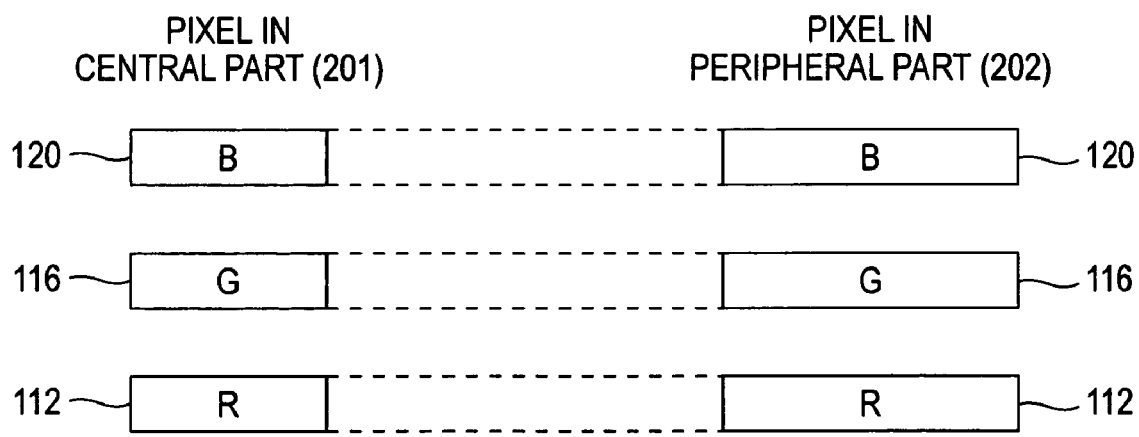
FIGS. 4A and 4B are typical sectional views showing photoelectric converting layer portions of the photoelectric converting layer lamination type solid-state image pick-up devices according to the third and fourth embodiments of the invention.

FIG. 4A is a typical sectional view showing photoelectric converting layer portions of the pixel 201 in the central part of the device and the pixel 202 in the peripheral part of the device shown in FIG. 3. It is shown that areas of the photoelectric converting layers 112, 116 and 120 to be the first, second and third layers of the pixel 202 in the peripheral part of the device are larger than those of the photoelectric converting layers 112, 116 and 120 to be the first, second and third layers of the pixel 201 in the central part of the device.

According to the photoelectric converting layer lamination type solid-state image pick-up device in accordance with the embodiment, the pixel in the peripheral part of the device has a larger area and a larger light receiving area. Even if a quantity of a light in the peripheral part is reduced, therefore, the light receiving area of the pixel in the peripheral part is increased. Consequently, it is possible to avoid shading.

Figure 4B:
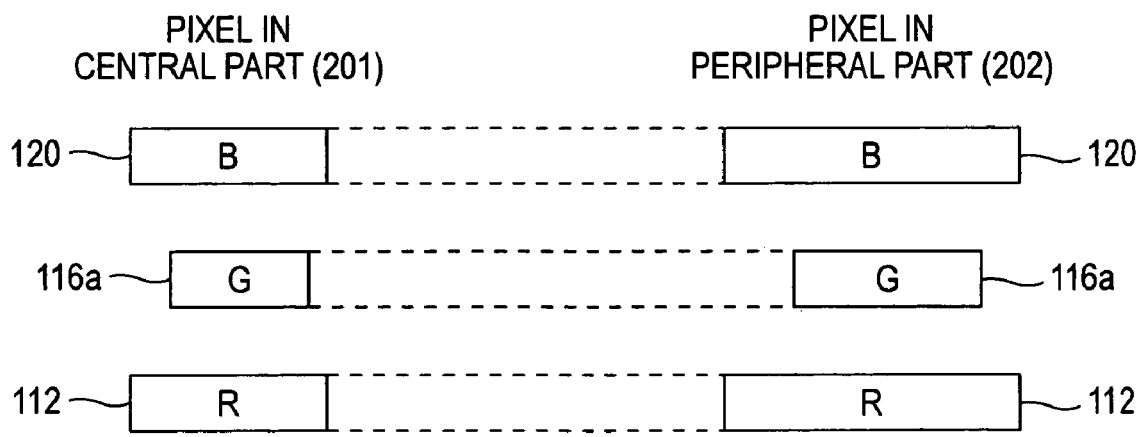

FIG. 4B is an explanatory view showing a photoelectric converting layer lamination type solid-state image pick-up device according to a fourth embodiment of the invention. The photoelectric converting layer lamination type solid-state image pick-up device according to the embodiment has a structure obtained by combining the second and third embodiments, in which a pixel area is more increased toward a peripheral part of a device and an area of a photoelectric converting layer to be each layer is set corresponding to a sensitivity of the photoelectric converting layer to be each layer. Consequently, shading can be avoided and a light receiving sensitivity of the photoelectric converting layer for each color can be made uniform so that an image of high picture quality can be picked up.

According to the invention, the pixel separation performance of the detection signal is increased so that the S/N can be enhanced. Moreover, the difference in the sensitivity for each color is suppressed so that the picture quality can be improved, and furthermore, the generation of the shading can be suppressed.

In the photoelectric converting layer lamination type solid-state image pick-up device according to the invention, a pixel separation performance can be enhanced. Consequently, S/N of a detection signal can be enhanced, a color balance can be improved and shading can easily be avoided. Consequently, the photoelectric converting layer lamination type solid-state image pick-up device is useful as a solid-state image pick-up device in place of the related-art image sensor of a CCD type or a CMOS type.

The entire disclosure of each and every foreign patent application from which the benefit of foreign priority has been claimed in the present application is incorporated herein by reference, as if fully set forth.

What is claimed is:

1. A photoelectric converting layer lamination type solid-state image pick-up device comprising:
a semiconductor substrate;
at least three layers of photoelectric converting layers each of which is interposed between a common electrode layer and pixel electrode layers, the pixel electrode layers corresponding to pixels respectively,
wherein said at least three layers of photoelectric converting layers are laminated through insulating layers, said at least three layers of photoelectric converting layers being above the semiconductor substrate, and
wherein each of said at least three layers of photoelectric converting layers is separated into layers corresponding the pixels respectively.

2. The photoelectric converting layer lamination type solid-state image pick-up device according to claim 1, wherein an area of each of said at least three layers of photoelectric converting layers is set corresponding to each of photoelectric converting characteristics of said at least three layers of photoelectric converting layers.

3. The photoelectric converting layer lamination type solid-state image pick-up device according to claim 1, wherein an area of each of said at least three layers of photoelectric converting layers for a pixel in a peripheral part of the solid-state image pick-up device is set to be larger than that of each of said at least three layers of photoelectric converting layers for a pixel in a central part of the solid-state image pick-up device.

4. The photoelectric converting layer lamination type solid-state image pick-up device according to claim 2, wherein an area of each of said at least three layers of photoelectric converting layers for a pixel in a peripheral part of the solid-state image pick-up device is set to be larger than that of each of said at least three layers of photoelectric converting layers for a pixel in a central part of the solid-state image pick-up device.

* * * * *